(12) United States Patent
Jimenez Martinez

(10) Patent No.: US 11,823,947 B2
(45) Date of Patent: Nov. 21, 2023

(54) METHOD FOR MANUFACTURING AN INTEGRATED CIRCUIT COMPRISING AN N-TYPE LATERALLY DIFFUSED METAL OXIDE SEMICONDUCTOR (NLDMOS) TRANSISTOR

(71) Applicant: STMicroelectronics (Crolles 2) SAS, Crolles (FR)

(72) Inventor: Jean Jimenez Martinez, Salles d'Aude (FR)

(73) Assignee: STMicroelectronics (Crolles 2) SAS, Crolles (FR)

( * ) Notice: Subject to any disclaimer, the term of this patent is extended or adjusted under 35 U.S.C. 154(b) by 0 days.

(21) Appl. No.: 17/978,533

(22) Filed: Nov. 1, 2022

(65) Prior Publication Data

US 2023/0052676 A1    Feb. 16, 2023

Related U.S. Application Data

(62) Division of application No. 17/095,003, filed on Nov. 11, 2020, now Pat. No. 11,515,415.

(30) Foreign Application Priority Data

Nov. 15, 2019   (FR) ...................................... 1912793

(51) Int. Cl.
*H01L 21/74*    (2006.01)
*H01L 27/06*    (2006.01)
(Continued)

(52) U.S. Cl.
CPC .............. *H01L 21/74* (2013.01); *H01L 21/02* (2013.01); *H01L 21/266* (2013.01);
(Continued)

(58) Field of Classification Search
CPC .............. H01L 21/336; H01L 21/8249; H01L 21/8234; H01L 21/8248; H01L 21/02; H01L 21/266; H01L 21/74; H01L 29/7817; H01L 27/0623; H01L 29/0615; H01L 29/66234; H01L 29/66681; H01L 29/7302; H01L 29/7816; H01L 29/0878; H01L 29/1083
See application file for complete search history.

(56) References Cited

U.S. PATENT DOCUMENTS

| | | | |
|---|---|---|---|
| 7,960,222 B1 * | 6/2011 | Kwon .................. | H01L 27/0928 438/341 |
| 9,911,814 B2 | 3/2018 | Nitta et al. | |

(Continued)

OTHER PUBLICATIONS

INPI Search Report and Written Opinion for FR 1912793 dated Jun. 25, 2020 (9 pages).

*Primary Examiner* — Shouxiang Hu
(74) *Attorney, Agent, or Firm* — CROWE & DUNLEVY

(57) ABSTRACT

An integrated circuit includes an N-type laterally diffused metal-oxide semiconductor (NLDMOS) transistor including an active semiconductor substrate region having P-type conductivity. The integrated circuit further includes a buried semiconductor region having N+-type conductivity underneath the active substrate region. The buried semiconductor region is more heavily doped than the active semiconductor substrate region.

11 Claims, 3 Drawing Sheets

(51) Int. Cl.
  *H01L 29/66* (2006.01)
  *H01L 29/73* (2006.01)
  *H01L 29/78* (2006.01)
  *H01L 29/06* (2006.01)
  *H01L 21/8249* (2006.01)
  *H01L 21/266* (2006.01)
  *H01L 21/02* (2006.01)

(52) U.S. Cl.
  CPC ...... *H01L 21/8249* (2013.01); *H01L 27/0623* (2013.01); *H01L 29/0615* (2013.01); *H01L 29/66234* (2013.01); *H01L 29/66681* (2013.01); *H01L 29/7302* (2013.01); *H01L 29/7816* (2013.01); *H01L 29/7817* (2013.01)

(56) References Cited

U.S. PATENT DOCUMENTS

| | | | |
|---|---|---|---|
| 2007/0246738 | A1 | 10/2007 | Otake |
| 2007/0296046 | A1* | 12/2007 | Ohdaira .............. H01L 29/7835 257/E21.336 |
| 2010/0301413 | A1 | 12/2010 | You |
| 2011/0215373 | A1 | 9/2011 | Kwon |
| 2011/0241083 | A1* | 10/2011 | Khemka ........... H01L 29/66659 257/E27.059 |
| 2012/0043608 | A1* | 2/2012 | Yang ................ H01L 29/66659 438/286 |
| 2017/0170262 | A1 | 6/2017 | Kuwazawa et al. |
| 2017/0213894 | A1 | 7/2017 | Mallikarjunaswamy |

* cited by examiner

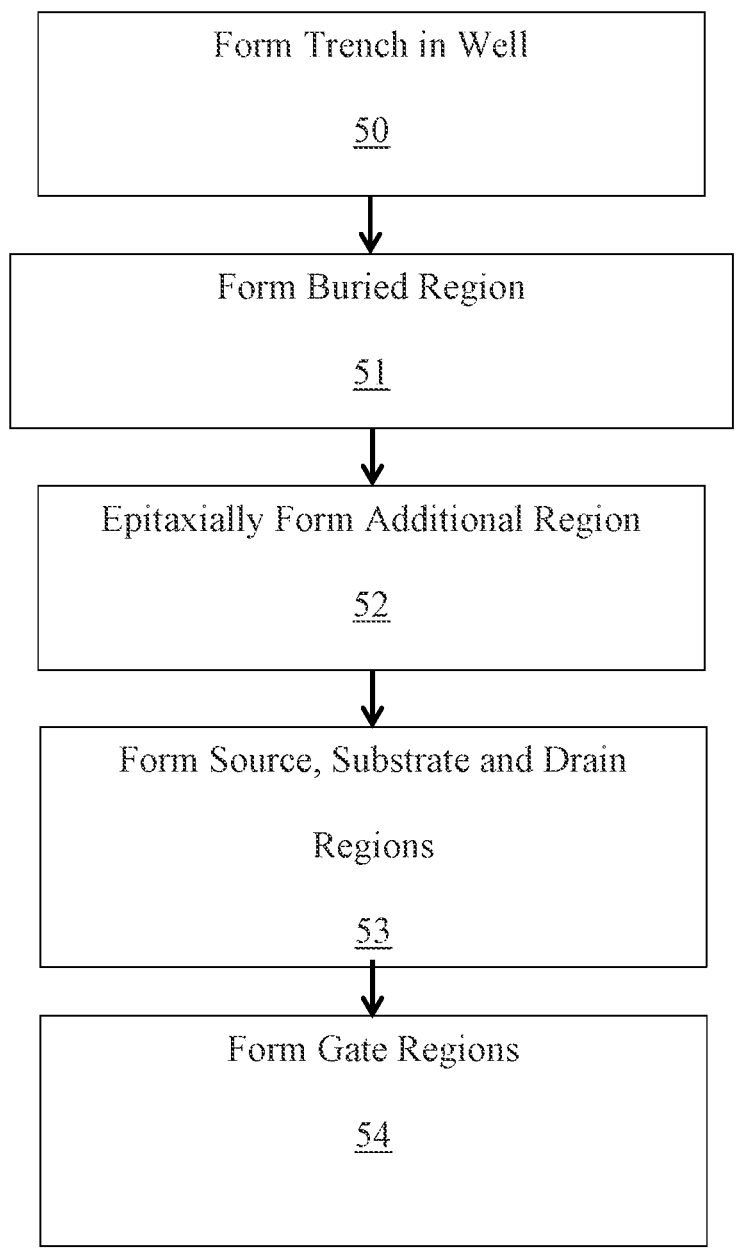

METHOD FOR MANUFACTURING AN INTEGRATED CIRCUIT COMPRISING AN N-TYPE LATERALLY DIFFUSED METAL OXIDE SEMICONDUCTOR (NLDMOS) TRANSISTOR

CROSS REFERENCE TO RELATED APPLICATION

This application is a divisional of U.S. patent application Ser. No. 17/095,003, filed Nov. 11, 2020, which claims the priority benefit of French Application for Patent No. 1912793, filed on Nov. 15, 2019, the contents of which are hereby incorporated by reference in their entireties to the maximum extent allowable by law.

TECHNICAL FIELD

Modes of implementation and embodiments relate to integrated circuits and, in particular, to integrated circuits comprising at least one N-type laterally diffused metal-oxide semiconductor (NLDMOS) transistor, and to the manufacture of such integrated circuits.

BACKGROUND

Laterally diffused metal-oxide semiconductor transistors are known to those skilled in the art under the acronym LDMOS.

LDMOS transistors are used in particular in radiofrequency amplifiers, in current and power controllers and for power supply management.

N-type LDMOS transistors, called NLDMOS transistors, are generally used for low side drivers. P-type LDMOS transistors, called PLDMOS transistors, are for their part generally used for high side drivers.

However, it would be advantageous to use NLDMOS transistors for high side drivers. Specifically, NLDMOS transistors have better intrinsic performance in comparison with PLDMOS transistors, in particular in terms of control capability in terms of current and performance in terms of frequency.

However, known NLDMOS transistors are not suitable for high-voltage operation for high side drivers.

FIG. 1 shows a structure of a known NLDMOS transistor 10. Such an NLDMOS transistor 10 is formed in an N-type well 11 formed in a P-type semiconductor substrate 12. The NLDMOS transistor 10 comprises: an N-type drain region 13, a source region 14, a P-type active substrate region or body 15, and a substrate contact zone 16 formed in the active substrate region 15. The source region 14 and substrate regions 15, 16 are connected together by a metallization 26. The transistor also comprises two gate regions 17.

This NLDMOS transistor structure generates a stray PNP bipolar transistor effect 18 between the active substrate region 15 and the semiconductor substrate during high-voltage operation. This stray PNP bipolar transistor effect thus limits the use of NLDMOS transistors to low-voltage operation for high side drivers.

There is therefore a need to be able to provide an integrated circuit comprising an NLDMOS transistor designed to be able to operate at a high voltage, in particular for high side drivers.

SUMMARY

According to one aspect, an integrated circuit comprises: an N-type laterally diffused metal-oxide semiconductor transistor, called NLDMOS transistor, comprising an active semiconductor substrate region having P-type conductivity. According to this aspect, the integrated circuit further comprises, underneath the active substrate region, a buried semiconductor region having $N^+$-type conductivity and that is more heavily doped than the active substrate region.

The buried $N^+$-type region makes it possible to reduce the stray PNP bipolar transistor effect, or even to prevent this stray PNP bipolar transistor effect from triggering when the NLDMOS transistor is used in a high side driver. In particular, the buried $N^+$-type region makes it possible to considerably reduce the current gain of the stray PNP structure (between the active substrate region of the NLDMOS transistor and the P-type semiconductor substrate).

The buried $N^+$-type region makes it possible to increase the triggering voltage of the stray PNP bipolar transistor effect to a level high enough not to impair high-voltage operation of the NLDMOS transistor.

In particular, the buried $N^+$-type region has a dopant concentration high enough to reduce this stray PNP bipolar transistor effect. For example, according to some embodiments, the buried semiconductor region underneath the active substrate region of the NLDMOS transistor has a dopant concentration greater than or equal to $2\times10^{19}$ atoms/$cm^3$ (at./$cm^3$). The buried semiconductor region is thus heavily doped.

According to one embodiment, the integrated circuit comprises an additional N-type region, for example produced through epitaxy, situated between the active substrate region of the NLDMOS transistor and the buried $N^+$-type region, the buried $N^+$-type region being situated at the interface between the P-type semiconductor substrate and the additional N-type region.

According to one embodiment, the integrated circuit comprises an N-type semiconductor well surrounding the additional region and the active substrate region and containing a drain region of the NLDMOS transistor.

Such an integrated circuit may comprise a plurality of NLDMOS transistors and buried regions as described above.

According to one embodiment, the integrated circuit also comprises at least one NPN-type bipolar transistor and a buried semiconductor layer having N-type conductivity situated underneath the bipolar transistor. The buried semiconductor layer underneath the bipolar transistor and the buried semiconductor region underneath the NLDMOS transistor are furthermore situated at the same depth and have the same dopant concentration.

Such an integrated circuit therefore comprises at least one bipolar transistor and at least one NLDMOS transistor. Such an integrated circuit may comprise a plurality of NLDMOS transistors and a plurality of bipolar transistors and buried regions as described above.

The integrated circuit may also comprise CMOS transistors. Such an integrated circuit may thus in particular be used in BiCMOS (bipolar CMOS) technology.

According to another aspect, a method for manufacturing an integrated circuit comprises forming an N-type laterally diffused metal-oxide semiconductor transistor, called NLDMOS transistor, comprising an active semiconductor substrate region having P-type conductivity.

According to this aspect, the method further comprises forming, underneath the active substrate region, a buried semiconductor region having N-type conductivity and that is more heavily doped than the active substrate region.

According to one mode of implementation, the manufacturing method further comprises forming a P-type semiconductor substrate and forming, through epitaxy, an additional N-type region situated between the active substrate region of the NLDMOS transistor and the buried region underneath the active substrate region of the NLDMOS transistor, this buried region being formed through dopant implantation and situated at the interface between the substrate and this additional region.

According to one mode of implementation, the method further comprises forming an NPN-type bipolar transistor and forming a buried semiconductor layer having N-type conductivity underneath the bipolar transistor. The buried semiconductor layer underneath the bipolar transistor and the buried semiconductor region underneath each NLDMOS transistor are furthermore formed simultaneously.

Forming the buried region underneath the active substrate region of the NLDMOS transistor therefore does not require a dedicated additional step. Forming the buried region underneath the active substrate region of the NLDMOS transistor is therefore inexpensive.

BRIEF DESCRIPTION OF THE DRAWINGS

Other advantages and features of the invention will become apparent on examining the detailed description of completely non-limiting modes of implementation and embodiments and the appended drawings, in which:

FIG. 3 shows an example of a method for manufacturing an integrated circuit such as shown in FIG. 2;

FIG. 5 shows an example of a method for manufacturing.

DETAILED DESCRIPTION

Figure 1:
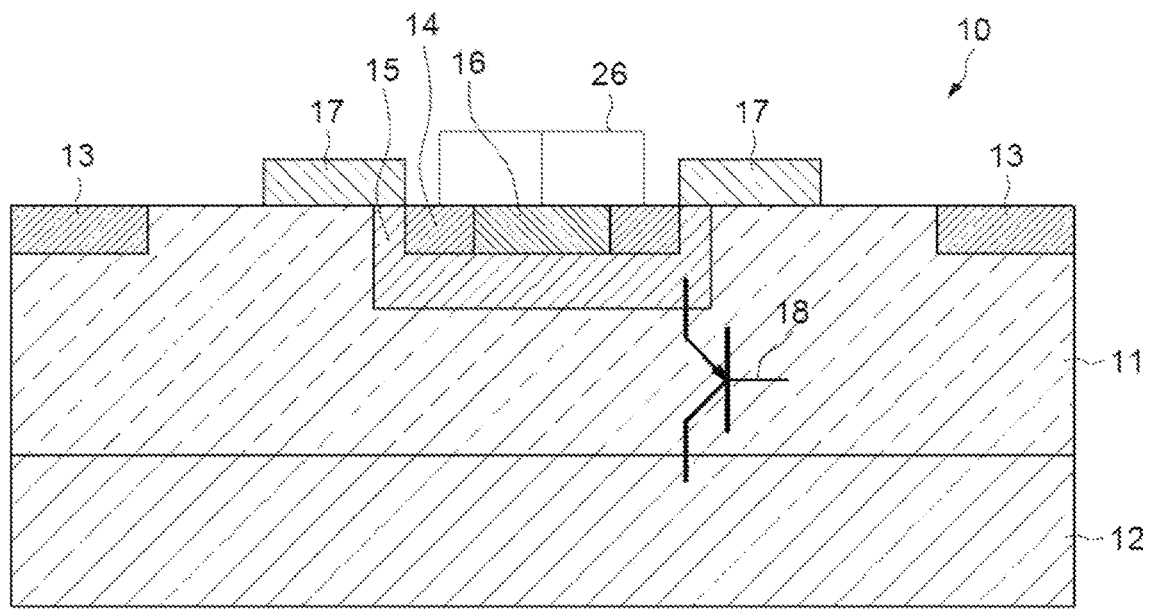
FIG. 1 shows a structure of a known NLDMOS transistor.
Figure 2:
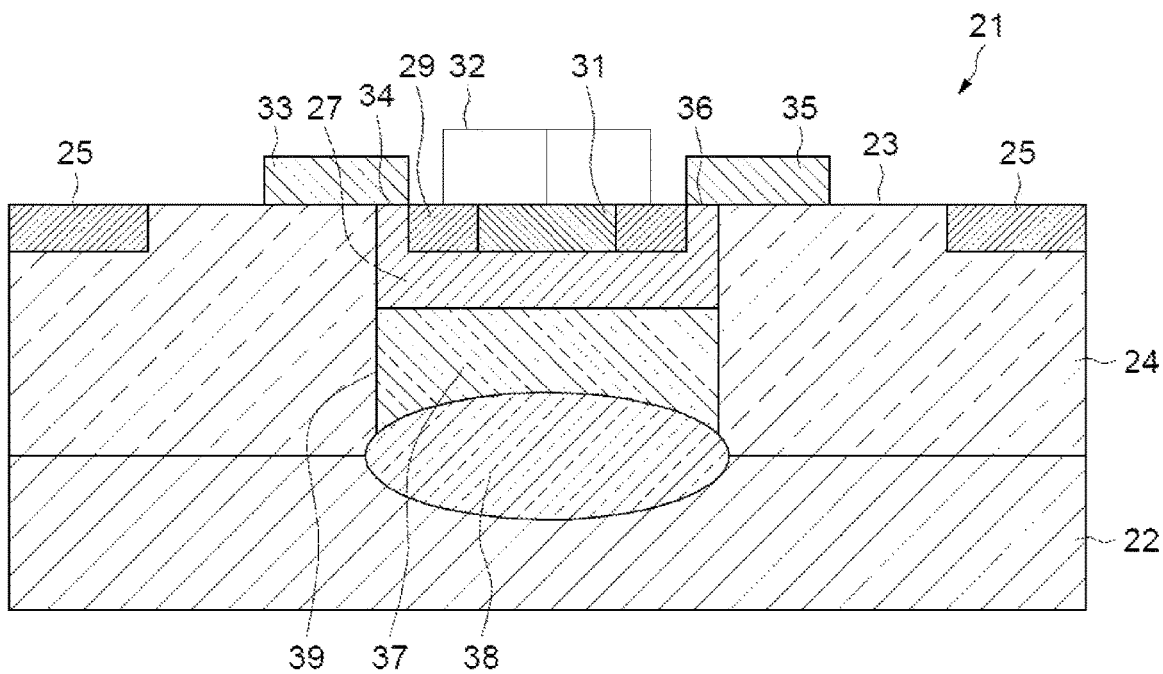
FIG. 2 shows an integrated circuit comprising an NLDMOS transistor.

FIG. 2 shows an integrated circuit 20 according to one embodiment comprising an N-type laterally diffused metal-oxide semiconductor transistor, called NLDMOS transistor 21.

The NLDMOS transistor 21 is formed on a semiconductor substrate 22 having P-type conductivity. For example, the semiconductor substrate 22 has a dopant concentration of the order of $10^{15}$ at./cm$^3$.

More particularly, the NLDMOS transistor 21 is formed in a well 24 with N-type conductivity that is incorporated into the P-type semiconductor substrate 22. For example, the well 24 has a dopant concentration of the order of $10^{17}$ at./cm$^3$. The well 24 extends downwards from a front face 23.

More particularly, the NLDMOS transistor 21 comprises a drain region 25 with N-type conductivity. The drain region 25 is heavily doped in order to make it easier to create contact.

The NLDMOS transistor 21 further comprises an $N^+$-doped source region 29 and a P-type active substrate region (body) 27 and a $P^+$-doped substrate contact zone 31 formed in the active substrate region 27. For example, the active substrate region 27 has a dopant concentration of the order of $10^{17}$ at./cm$^3$. The source region 29 and substrate regions 27, 31 are connected together by a metallization 32.

The NLDMOS transistor 21 also comprises two gate regions 33, 35 on top of the front face 23.

The integrated circuit 20 also comprises an additional region 37 with N-type conductivity, situated underneath the active substrate region 27. This additional region 37 is laterally surrounded by the well 24. More particularly, this additional region 37 has a dopant concentration of the order of $10^{17}$ at./cm$^3$.

The additional region 37 extends downwards from the active substrate region 27 of the NLDMOS transistor 21 to a buried semiconductor region 38 with N-type conductivity, situated underneath said additional region 37. The buried semiconductor region 38 is doped with a dose of the order of $2\times10^{19}$ at./cm$^3$. The buried region 38 is therefore situated at the interface between the region 37 and the substrate 22.

The buried $N^+$-type region 38 makes it possible to increase the triggering voltage of the stray PNP bipolar transistor effect to a level high enough not to impair high-voltage operation of the NLDMOS transistor 21. In particular, the buried $N^+$-type region 38 makes it possible to considerably reduce the current gain of the stray PNP structure (between the active substrate region 27 of the NLDMOS transistor 21 and the P-type semiconductor substrate 22). The buried $N^+$-type region 38, due to its high doping, is thus used to reduce the stray PNP bipolar transistor effect, or even to prevent this stray PNP bipolar transistor effect from triggering when the NLDMOS transistor 21 is used in a high side driver.

FIG. 3 shows an example of a method for manufacturing an integrated circuit 20 such as the one shown in FIG. 2. This manufacturing method comprises, after forming the well 24 in the substrate 22 in a conventional and known manner, a step 50 of forming a trench 39 in the well 24 by etching until reaching the substrate 22.

The manufacturing method then comprises a step 51 of forming the buried semiconductor region 38 by implanting dopants in the substrate 22 at the bottom of the trench.

The manufacturing method then comprises a step 52 of forming the additional region 37 through epitaxy.

The manufacturing method then comprises a step 53 of forming the source, substrate and drain regions through dopant implantation.

The manufacturing method then comprises a step 54 of forming the gate regions of the NLDMOS transistor 21.

Figure 4:
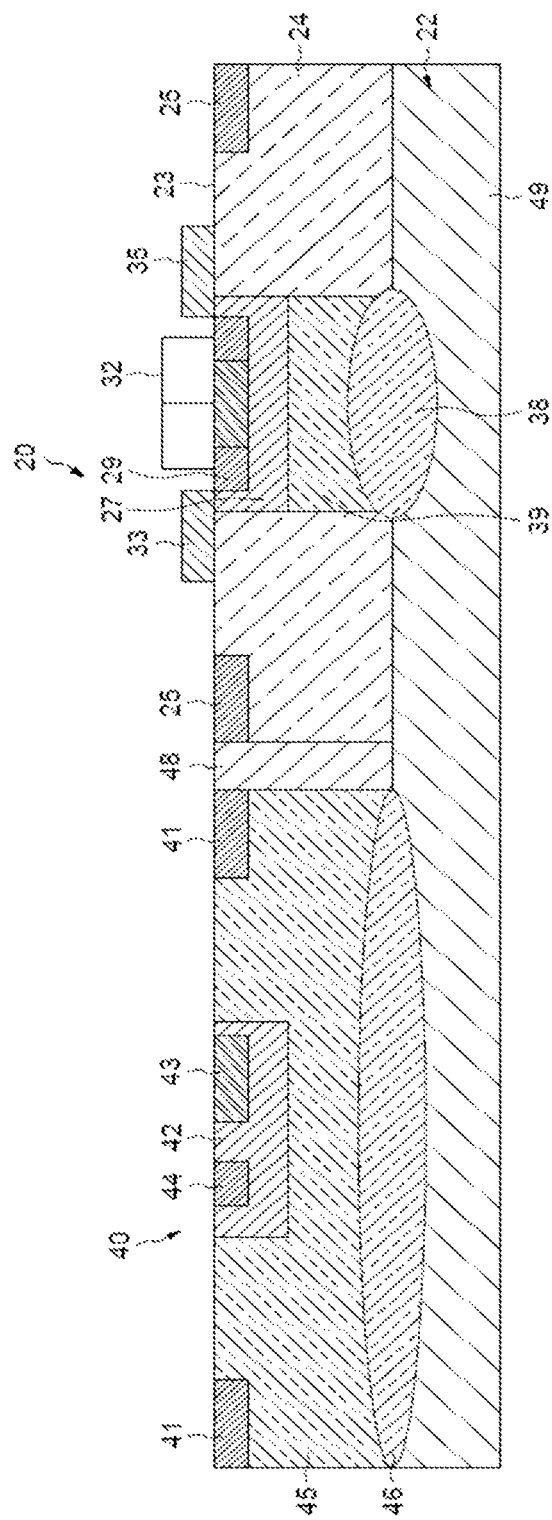
FIG. 4 shows an integrated circuit comprising an NPN-type bipolar transistor and an NLDMOS transistor 21 having a structure identical to that shown in FIG. 2.

FIG. 4 shows an integrated circuit 20 comprising an NPN-type bipolar transistor 40 and an NLDMOS transistor 21 having a structure identical to the one described in FIG. 2. In particular, the bipolar transistor 40 and the NLDMOS transistor 21 are formed on the same semiconductor substrate 22 having a common region with P-type conductivity, such as the one described above. The NLDMOS transistor 21 is separated from the bipolar transistor 40 by a deep trench isolation (DTI) 48.

The bipolar transistor 40, as is conventional, has an $N^+$-type emitter region 44, a $P^+$-doped extrinsic base region 43, a P-doped intrinsic base region 42, an extrinsic collector region 41 and an intrinsic collector region 45.

The bipolar transistor 40 also has a buried layer 46 situated at the interface between the intrinsic collector 45 and the underlying substrate 22.

The buried layer 46 of the bipolar transistor 40 and the buried region 38 of the NLDMOS transistor 21 are situated at the same depth with respect to a front face 23 and have the same dopant concentration.

Specifically, as illustrated schematically in FIG. 5, in step 510, the buried semiconductor layer 46 underneath the bipolar transistor 40 and the buried semiconductor region 38 underneath each NLDMOS transistor 21 are formed at the same time.

Forming the buried region 38 underneath the active substrate region 27 of the NLDMOS transistor 21 therefore does not require a dedicated additional step. Forming the buried region 38 underneath the active substrate region 27 of the NLDMOS transistor 21 is therefore inexpensive.

Furthermore, the intrinsic collector region 45 of the bipolar transistor 40 and the additional region 37 situated underneath the NLDMOS transistor 21 are formed simultaneously.

The invention claimed is:

1. A method for manufacturing an integrated circuit including an N-type laterally diffused metal-oxide semiconductor (NLDMOS) transistor, comprising:
    forming a semiconductor well having N-type conductivity over an active semiconductor substrate region having P-type conductivity;
    forming a trench extending through the semiconductor well;
    forming a buried semiconductor region having N-type conductivity at a bottom of the trench;
    epitaxially growing an additional N-type conductivity region within the trench over the buried semiconductor region;
    forming an active substrate region having P-type conductivity within the trench over the additional N-type conductivity region;
    forming a drain region of the NLDMOS transistor in the semiconductor well; and
    forming a source region of the NLDMOS transistor in the active substrate region.

2. The method according to claim 1, wherein the buried semiconductor region having N-type conductivity is more heavily doped than the active semiconductor substrate region.

3. The method according to claim 1, wherein forming the buried semiconductor region comprises performing a dopant implantation.

4. The method according to claim 1, further comprising:
    forming an NPN-type bipolar transistor;
    forming a buried semiconductor region having N-type conductivity underneath the bipolar transistor;
    wherein forming the buried semiconductor region underneath the bipolar transistor and forming the buried semiconductor region underneath said NLDMOS transistor are performed simultaneously.

5. A method for manufacturing an integrated circuit including an N-type laterally diffused metal-oxide semiconductor (NLDMOS) transistor, comprising:
    forming a semiconductor well with N-type conductivity over a P-type semiconductor substrate;
    opening a trench extending through a thickness of said semiconductor well;
    forming a buried semiconductor region having N+-type conductivity located in the P-type semiconductor substrate at a bottom of said trench;
    forming an additional region made of epitaxial material with N-type conductivity in contact with said buried semiconductor region in the trench;
    forming an active semiconductor body region of said NLDMOS transistor having P-type conductivity situated within the trench and over said additional region;
    forming a source region of said NLDMOS transistor having an N-type conductivity in said active semiconductor body region; and
    forming a drain region of said NLDMOS transistor having an N-type conductivity contained within said semiconductor well.

6. The method according to claim 5, wherein an at./cm$^3$ dopant concentration in the buried semiconductor region is greater than an at./cm$^3$ dopant concentration in the active semiconductor body region.

7. The method according to claim 5, wherein the buried semiconductor region is situated at an interface between the P-type semiconductor substrate and the additional region.

8. The method according to claim 5, further comprising:
    forming an NPN-type bipolar transistor; and
    forming a buried semiconductor region having N-type conductivity located underneath the NPN-type bipolar transistor;
    wherein forming the buried semiconductor region underneath the NPN-type bipolar transistor and forming the buried semiconductor region at the bottom of said trench are performed simultaneously.

9. A method for manufacturing an integrated circuit transistor including a source region, a body region and a drain region, comprising:
    forming a semiconductor well over a semiconductor substrate;
    wherein the semiconductor substrate is doped with a first conductivity type and the semiconductor well is doped with a second conductivity type;
    wherein said semiconductor well supports said drain region;
    forming a trench extending through a thickness of said semiconductor well;
    forming a buried semiconductor region doped with the second conductivity type located at a bottom of said trench at a location that is level with an interface between the semiconductor substrate and the semiconductor well;
    epitaxially growing an additional region doped with the second conductivity type situated within said trench over the buried semiconductor region; and
    forming an active semiconductor substrate region doped with the first conductivity type within said trench over the epitaxially grown an additional region;
    wherein said active semiconductor substrate region provides the body region and supports the source region.

10. The method according to claim 9, wherein the semiconductor well and the buried semiconductor region preclude direct physical contact between the additional region and the semiconductor substrate.

11. The method according to claim 9, wherein an at./cm$^3$ dopant concentration in the buried semiconductor region is greater than an at./cm$^3$ dopant concentration in the active semiconductor substrate region.

* * * * *